United States Patent [19]
Caillat

[11] Patent Number: 6,019,883
[45] Date of Patent: Feb. 1, 2000

[54] PROCESS FOR PRODUCING A DEPOSIT ON A REMOVABLE SUPPORT

[75] Inventor: Patrice Caillat, Echinolles, France

[73] Assignee: Commissariat a l'Energie Atomique, France

[21] Appl. No.: 08/823,581

[22] Filed: Mar. 25, 1997

[30] Foreign Application Priority Data

Mar. 26, 1996 [FR] France .................................. 96 03727

[51] Int. Cl.[7] .............................. C25D 1/00; C25D 5/02
[52] U.S. Cl. .............................. 205/67; 205/78; 205/118; 205/122; 205/123; 205/136; 205/164
[58] Field of Search .............................. 205/67, 78, 118, 205/122, 123, 136; 204/164; 439/91

[56] References Cited

U.S. PATENT DOCUMENTS

| | | | |
|---|---|---|---|
| 3,230,163 | 1/1966 | Dreyfus | 204/281 |
| 3,350,250 | 10/1967 | Sanz et al. | 156/150 |
| 3,878,061 | 4/1975 | Feldstein | 204/11 |
| 4,608,129 | 8/1986 | Tamamura et al. | 204/18.1 |
| 5,135,606 | 8/1992 | Kato et al. | 156/631 |
| 5,328,580 | 7/1994 | Reamey | 204/181.1 |
| 5,474,458 | 12/1995 | Vati et al. | 439/91 |
| 5,681,647 | 10/1997 | Caillat | 428/209 |
| 5,731,073 | 3/1998 | Knott et al. | 428/304.4 |

FOREIGN PATENT DOCUMENTS

WO 9422889  10/1994  WIPO .

OTHER PUBLICATIONS

Patent Abstracts of Japan, vol. 16, No. 472 (E–1272), Sep. 30, 1992.

Sensors and Actuators A, vol. 43, 1994 Month not available, pp. 296–301, XP000567518, Kakerow et al, "A Monolithic Sensor Array of Individual Addressable Microelectrodes".

Sensors and Actuators B, vol. 19, Apr. 1994, pp. 675–677, XP000449927, Fiaccabrino et al, "Array of Individually Addressable Microelectrodes".

Semiconductor FabTech, pp. 289–295, John Franka et al., "Technology: Present and Future" Date not available.

*Primary Examiner*—Donald R. Valentine
*Assistant Examiner*—William T. Leader
*Attorney, Agent, or Firm*—Burns, Doane, Swecker & Mathis, L.L.P.

[57] ABSTRACT

The invention relates to a process for the production of an electro-chemical deposit (8-1, . . . , 8-4) with the aid of a substrate (2) having connection pieces (4-1, . . . , 4-5), said pieces being used as electrodes, the deposit taking place on the surface of a removable support (6) and which can be subsequently separated from the substrate on areas of said surface in electrical contact with the pieces of the substrate.

35 Claims, 9 Drawing Sheets

PROCESS FOR PRODUCING A DEPOSIT ON A REMOVABLE SUPPORT

TECHNICAL FIELD

The invention relates to procedures for forming a deposit on a substrate. Deposits can be obtained electrochemically. A special case is electrolytic deposits. This procedure is used in metallurgy for covering certain parts. It is also used in microelectronics, e.g. for depositing conductive elements on electrodes of a chip during manufacture.

A brief description will be given of the electrolytic deposition procedure in conjunction with FIG. 1. A part or electrode 1 on which the desired deposit is made is dipped in an electrolyte 3. A counterelectrode 13 is also dipped in said electrolyte. The part or electrode and the counterelectrode are connected to a voltage generator 7. The electrolyte has ions in solution, which are deposited on the part, as a function of their charge and the voltage applied by the generator. The deposit can be made on a complete part (in this case a surface metallurgy taking place) or on a portion of the part, as is the case in microelectronics.

This basic procedure is ever more frequently used. It was initially reserved for deposits of pure metals, such as copper or nickel. However, it has now been generalized to electrochemical deposits no longer requiring a displacement of simple ions, but displacements of complex compounds, obtained from organic substances. Use is e.g. made of oxidoreduction, which takes place on the part, in order to copolymerize together polymers.

Thus, the present invention relates to the electrolytic deposition of substances such as ions or complex compounds. However, it relates to all procedures for deposition on a substrate dipped in an atmosphere containing ions to be deposited.

PRIOR ART

As stated hereinbefore, the electrode or part to be treated can be a microelectronic component, such as a chip.

The document by J. FRANKA entitled "Solder Bump Technology: present and future", published in Semiconductor Fabtech, pp 289–295 describes a process for the deposition on the surface of a chip of a conductive material (tin-lead). For this purpose, the surface of the wafer on which the deposit is to be made is rendered conductive by spraying thereon a fine metal layer. A lithography stage is then performed by depositing a resin and exposure-development in order to open the resin at locations where a deposit is to be made. The wafer is then connected to a voltage generator by means of the fine conductive layer and is then immersed in an electrolyte. An electrolytic deposit is then made, particularly in the areas where the resin is open. The latter is then eliminated, after which the conductive layer is selectively etched only leaving behind the localized layer obtained during electrolytic growth. In general terms, this procedure can be applied to the case where a small number of pieces are to be made and/or a single material is to be deposited on said pieces.

The document by R. Kakerow et al entitled "A monolithic sensor array of individually addressable microelectrodes", published in Sensor and Actuator A, 43 (1994), pp 296–301, describes the simultaneous treatment of a large number of chips on the same semiconductor wafer, in order to selectively deposit a chemical compound on given electrodes of each chip.

The document entitled "Array of individually addressable microelectrodes", by G. C. Fiaccabrino et al, published in Sensor and Actuator B, 18–19 (1994), pp 675–677 describes a procedure multiplexing the electrodes of a chip in order to produce from said chip an electrode array sensor able to perform measurements in a chemical or biochemical medium. French patent application 95 13659 of Nov. 17, 1995 also describes a method making it possible, when several different materials have to be selectively deposited on chosen electrodes, to avoid the need for repeating on each occasion a new lithography stage, which can prove very expensive. This method also uses addressing and/or multiplexing means.

The prior art procedures all come up against a basic limitation. Once the electrochemical deposit or deposits have been made on the surface of a substrate, the latter can no longer be used. In particular, in the case where the substrate has active elements such as e.g. integrated addressing and multiplexing means used during the electrochemical deposition, said elements can no longer be reused for carrying out new deposits. Moreover, if for example different deposits, corresponding to independent devices, have been produced on the same substrate, the latter must be cut in order to be able to use the devices independently of one another. However, when making surface-localized deposits, a complete assembly involving the substrate and all the technology used (such as the addressing or multiplexing means) has to be purchased. For example, in the case of multiplexed electrode chips, the substrate integrates 10 to 12 microelectronic technology levels necessary for carrying out logic functions. The electrolytic deposition operation adds one or two technology levels and consequently the end product integrates about a dozen technological levels, whereof only the two last levels have in general an interest for the subsequent use.

DESCRIPTION OF THE INVENTION

The invention solves these problems by proposing a process for the production of an electrochemical deposit with the aid of a substrate having connection pieces or zones, the latter being used as the electrode, the deposit being made on the surface of a removable support and which can be subsequently separated from the substrate, on areas of said surface in electrical contact with the pieces of the substrate.

Thus, it is possible to separate the support and the portion deposited on the surface of the support from the substrate which enabled said deposit to be made. This permits a subsequent reuse of the substrate for carrying out other surface deposits. The expression producing an electrochemical deposit covers both the deposition of the same compound on independent areas and the deposition of several compounds on said areas. Moreover, the expression formation of the support on the substrate covers both the production of said support by construction on the substrate and the direct transfer to the substrate of a support already having electrical connections.

After producing a deposit and the separation from the support, the latter retains on its surface the deposited materials and the assembly can be cut in order to isolate the individual deposits or groups of deposits corresponding to the products to be produced, such as e.g. sensors.

The cost of the end product (with the deposit made) is reduced as a result of the possibility of reusing several times the costly part of the device. In particular, it is possible to reuse a complex addressing structure of electrodes integrated into the substrate, so that the latter becomes a tool and is no longer a sacrificial part of the device. However, even when the substrate incorporates no integrated active elements, the final deposit obtained can be cost competitive compared with deposits made according to conventional procedures, because the substrate is recovered on each occasion.

This process can comprise beforehand:

either the formation of the support on the substrate, said support then being subsequently separable from the substrate; or:

the formation of an intermediate layer on the substrate, the production of electrical connections between the pieces of the substrate and the upper surface of the intermediate layer, the formation of the support on the intermediate layer, said support being subsequently separable from the intermediate layer, the electrical connections of the intermediate layer permitting an electrical contacting of the substrate pieces with areas of the surface on which the deposit is to be made.

In the latter case, the intermediate layer can be a sacrificial layer which is selectively thermally or chemically etchable with respect to the substrate and the support. Thus, the intermediate layer can be a layer of epoxy adhesive or a polyimide layer and is then chemically etchable.

Moreover, said intermediate layer can be a thermoplastic adhesive layer or a layer of compounds based on paraffin, in which case it is thermally etchable.

The intermediate layer can also be a z anisotropic conductive film and in this case the film ensures the electrical connection between the substrate and the support. In other cases, electrical connections through the intermediate layer can be obtained by etching said intermediate layer above substrate pieces, followed by the deposition or growth of conductive materials in the thus obtained etched areas.

In all cases, the support can be an anisotropic conductive film or an anisotropic conductive elastomer. The electrical contact between the surface of the support and the substrate pieces is then ensured by the support, optionally via the electrical connections of the intermediate layer.

According to a variant, the support can be made from a polymeric material, such as polyimide, or an epoxy adhesive, or it can be a material based on a mineral compound, the process then also having a prior stage of producing electrical connections between the substrate pieces or electrical connections of the intermediate layer and the surface of the support on which the deposit is to be made, or between the z anisotropic conductive film constituting the intermediate layer and the surface of the support on which the deposit is to be made. There again, the stage of producing electrical connections can involve an etching of the support, above the substrate pieces, and a stage of depositing or growing conductive materials in the etched areas.

According to a particularly advantageous embodiment, at least certain of the etched areas have in each case a plurality of holes with axes substantially parallel to one another. This embodiment makes it possible to improve the separation or detachment of the support after making the deposit. Thus, when the electrode density or the density of the deposition areas becomes large, the insulating part of the "support" becomes small compared with the "electrical connection part". During a subsequent stage of separating the support from the substrate, tearing is to be feared. A solution to this problem consists of obtaining on the surface of the support large areas covered by the material chosen for the deposit, whilst retaining a large support material surface within the support. This result is obtained by giving to the etched area above at least certain pieces, the form of a plurality of holes with axes substantially parallel to one another.

Another particularly advantageous embodiment consists of producing beforehand connection microspheres on connection pieces of the substrate (or the intermediate layer), followed by the deposition of the constituent material of the support around said microspheres and above the substrate or intermediate layer.

The interest of this process is then the widening obtained above the electrical pieces due to the presence of the microspheres. Thus, the deposited support then coats the microspheres over a large surface. Therefore an easy mechanical detachment is obtained because, from the metallurgical standpoint, the sphere is only in contact with the pieces over a small surface.

In the case where the areas of the support on which the deposit is to be made are not or are only slightly compatible with the deposit material, it is possible to produce a prior deposit on said areas of a layer of material compatible with the final electrochemical deposit, such as e.g. a gold layer for depositing active molecules.

In all cases, the electrochemical deposit made must be a deposit of active molecules chosen from within the group of biochemical or biological molecules.

The substrate pieces can be directly connected to supply means (in this case a "passive" substrate is obtained). According to a variant, the substrate pieces can be connected to supply means by addressing and/or multiplexing means (in this case there is an "active" substrate).

The invention also relates to a deposit on a support, whereby said deposit can have been made electrochemically on a first face of said support, which has a second face in electrical contact with the first.

BRIEF DESCRIPTION OF THE DRAWINGS

The invention is described in greater detail hereinafter relative to non-limitative embodiments and with reference to the attached drawings, wherein show.

DETAILED DESCRIPTION OF EMBODIMENTS OF THE INVENTION

Figure 2A:
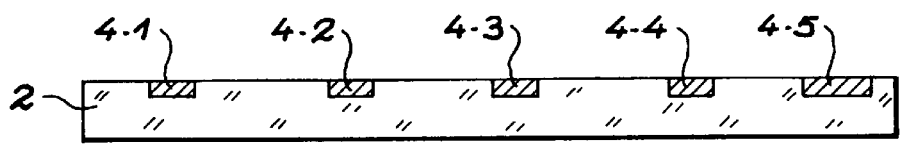
FIGS. 2A to 2D a first embodiment of the invention.

A first embodiment of the invention will now be described in conjunction with FIGS. 2A to 2D. A substrate 2 is firstly selected or prepared (FIG. 2A). This substrate has conductive zones or pieces 4-1, 4-2, 4-3, 4-4, 4-5. The pieces 4-i are diagrammatically shown, but can have any other possible shape, distribution or arrangement. In particular, these conductive zones or pieces can be electrodes of chips produced on a basic substrate using conventional microelectronic processes. An example of a component is given at the end of the present description in conjunction with FIG. 9.

Figure 2B:
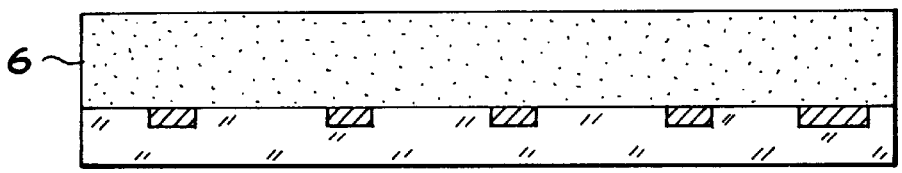

A Z conductive layer 6 is deposited on the substrate 2 (FIG. 2B). Such a layer can be a commercial anisotropic conductive film or a conductive elastomer. The thickness of this layer will be chosen as a function of the desired rigidity, which is itself determined by the subsequent use.

Figure 1:
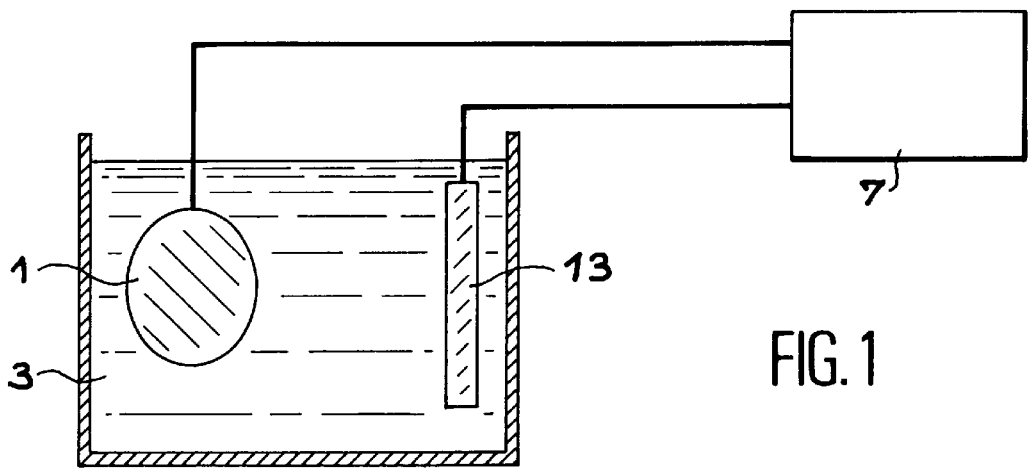
FIG. 1, already described, diagrammatically a device for producing an electrochemical deposit.
Figure 2C:
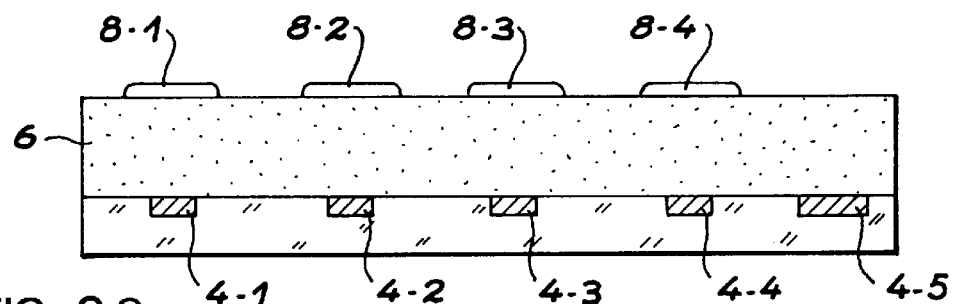

The pieces 4-i are connected by not shown conductive elements and the connection pieces to one or more voltage sources. The substrate Z-conductive layer 6 assembly is then dipped in a medium incorporating ions which are to be deposited on the surface of the layer 6. This medium can be a fluid medium, e.g. a chemical electrolyte bath in the case of an electrolytic deposit (FIG. 1) or, any other suitable deposition of medium. By selective addressing of the pieces, deposits 8-1, 8-2, 8-3, 8-4 are therefore made on the layer 6 (FIG. 2C). The deposits can be produced simultaneously if all the pieces 4-1 are simultaneously addressed by the voltage source. They can also be produced successively and e.g. firstly pieces 4-1 and 4-2 are addressed and the deposits 8-1, 8-2 are firstly made on the layer 6 in the areas facing pieces 4-1 and 4-2. The supply to said first pieces is then interrupted and the pieces 4-3, 4-4 are addressed and deposits 8-3, 8-4 are made facing the pieces 4-3, 4-4. Thus, it is possible to produce deposits of a particular nature above certain pieces, by firstly addressing said pieces and then by modifying the environment (e.g. by immersing the assembly in another electrolyte, another type of deposit can be made above other pieces.

Figure 2D:
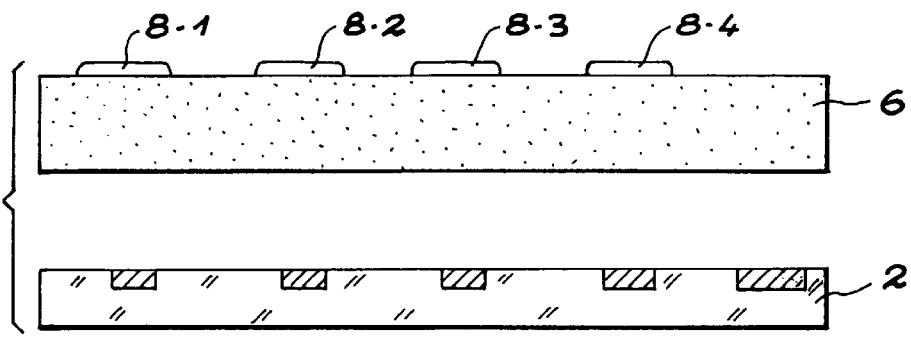

At the end of deposition, the layer 6 is separated from the substrate 2 (FIG. 2D). In the case of an anisotropic polymeric film or a z conductive elastomer, separation is obtained by thermal shock by acting on the thermal expansion difference between the support and the substrate or mechanically (by pulling off) or under UV irradiation, if the layer has, prior to its deposition, a face covered with a UV-sensitive adhesive.

Figure 9:
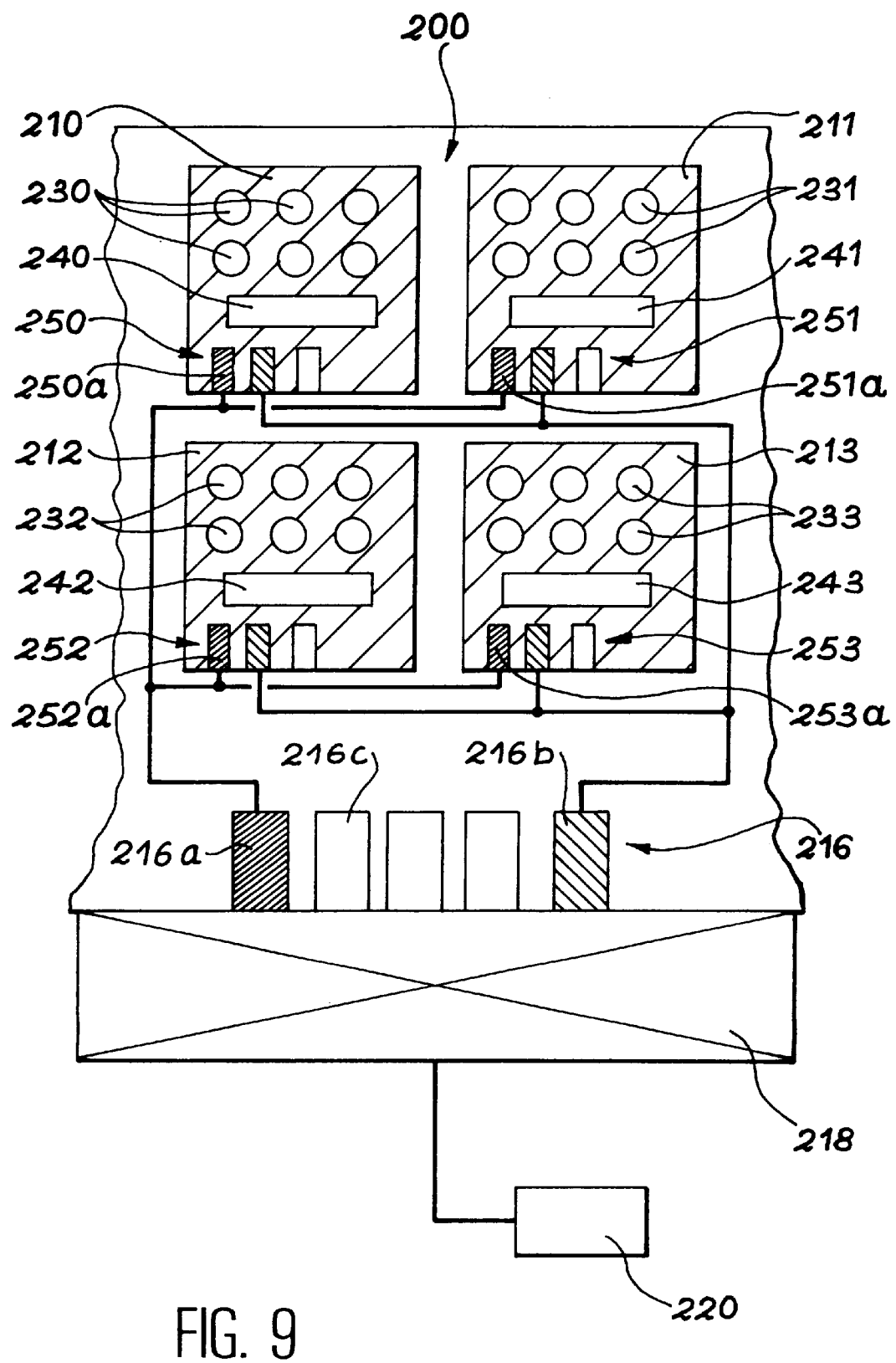
FIG. 9 an example of a substrate usable in a process according to the invention.

The result obtained is a film or layer 6, on whose surface specific deposits are made on chosen zones. The substrate 2 and its pieces 4-1 being separated, it is possible to reuse the same for another deposit on another layer. This is particularly advantageous in the case where said surface integrates, as illustrated in FIG. 9, a certain number of complex elements, such as addressing and multiplexing circuits.

The layer 6 can e.g. be cut in order to obtain individual deposits or grouped deposits usable as sensors, e.g. biological sensors of the type described in WO 94/22889. Such sensors are used in the field of biological characterization, the deposits 8-1 made then being e.g. deposits of active molecules, e.g. chosen from within the group of biochemical or biological molecules. These active molecules are reagents which react selectively during a biochemical or biological analysis.

A variant of the process according to the first embodiment of the invention will now be described in conjunction with FIGS. 3A to 3F. The starting element is a substrate 2 (identical to that described hereinbefore) with its pieces 4-1. On said substrate is deposited a sacrificial layer 5 (FIG. 3A), which is thermally etchable with respect to the support and substrate. As an example of a thermally etchable layer, reference can be made to thermoplastic adhesives and compounds based on paraffin. As an example of a layer chemically etchable with respect to the polyimide support, reference can be made to silicone or epoxy adhesive. This layer is then etched (FIG. 3B), so as to free openings 5-1, 5-2, 5-3, 5-4 above the pieces 4-i. The etching can e.g. be of the reactive plasma etching type in the presence of fluorine gas and can be performed through a resin mask produced e.g. by photolithography.

This is followed (FIG. 3C) by a deposition or growth stage for metal pieces 10-1–10-4 in openings 5-i. Deposition can take place by electrolytic growth, the metal being e.g. chromium, nickel or titanium. The pieces 10-1 can project with respect to the upper surface of the layer 5 or can be flush with said surface.

Figure 3A:
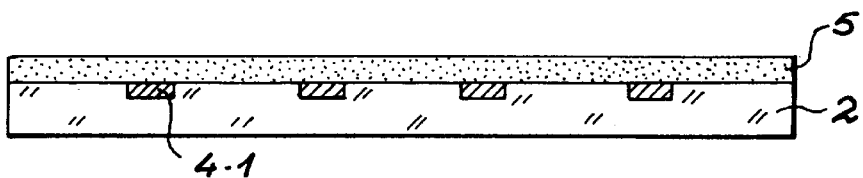
FIGS. 3A to 3F a variant of the first embodiment of the invention.
Figure 3B:
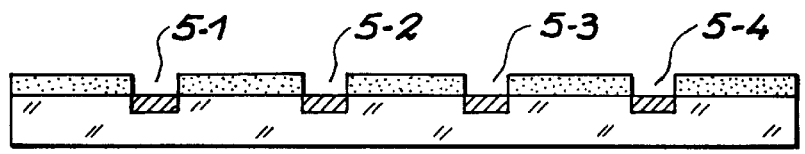
Figure 3C:
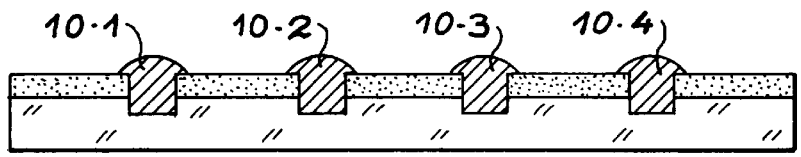
Figure 3D:
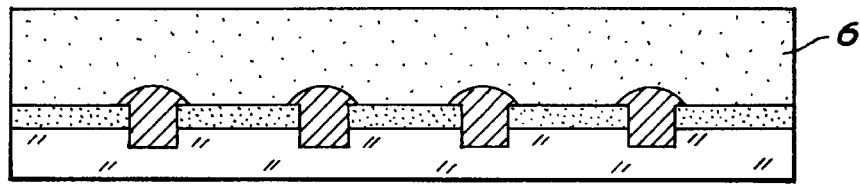
Figure 3:
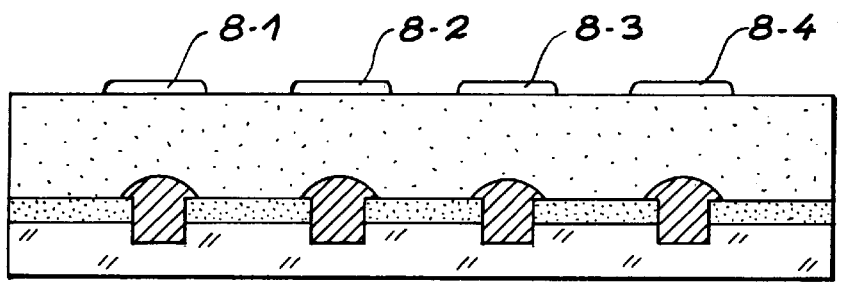
Figure 3:
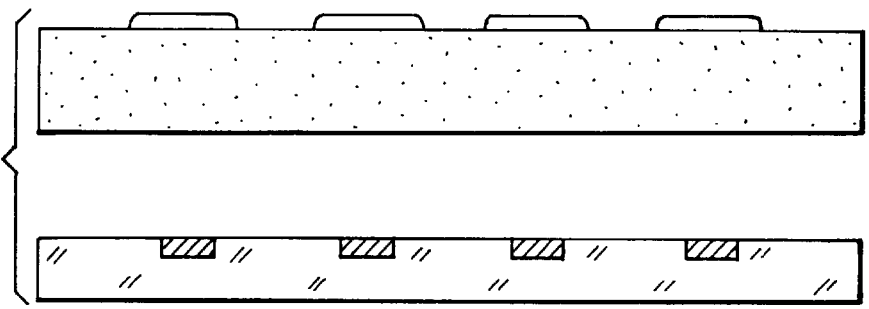

A conductive layer 6 is then deposited (FIG. 3D). The characteristics of said layer are the same as those given hereinbefore in connection with the description of the first embodiment. The pieces 10-1 make it possible to establish a contact between the pieces 4-1 of the substrate 2 and the layer 6. As described, it is thus possible to make deposits 8-1–8.4 in FIG. 3E in the manner described in conjunction with FIG. 2C, in the same type of environment, e.g. selectively in order to obtain deposits of different natures.

This is followed by the separation of the layer 6 and the substrate 2, e.g. by heating or chemically etching the sacrificial layer and advantageously the metal deposited for producing the pieces 10-1. In the case of a separation by heating, the temperature used must be below the deterioration temperature for the support. The result obtained, illustrated in FIG. 3F, is equivalent to that obtained in the first embodiment of the process (FIG. 2D), with the same possible uses and advantages.

Figure 4:
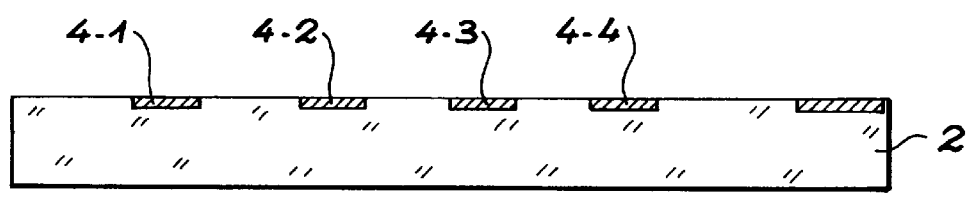
FIGS. 4A to 4D a second embodiment of the invention.
Figure 4:
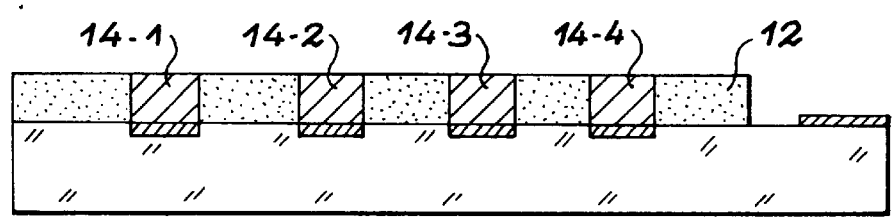
Figure 4:
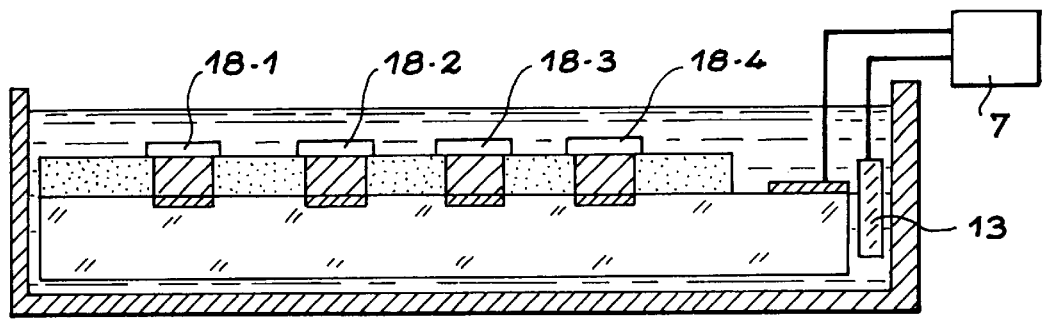
Figure 4:
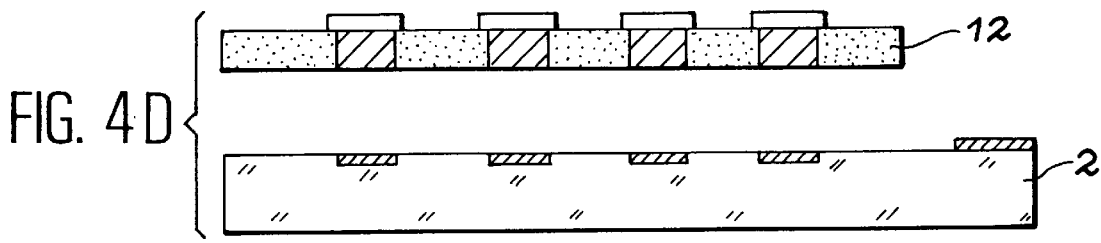

According to another embodiment of the invention, the support can be of an insulating material, such as a polymeric material or polyimide or an epoxy adhesive. It can also be a mineral material support, e.g. SOG (or liquid glass deposited by microelectronic means). As a result of the insulating character of the support, there are specific electrical connection means from the pieces to the surface of said support. The starting point of the process (FIG. 4A) is still a substrate 2 provided with its connection pieces 4-i. On said substrate is deposited an insulating material support 12. In the case of a polymer, the latter can be deposited in liquid form, e.g. with the trammel and is then annealed or transferred in film form to the structure. As illustrated in FIG. 4B, openings are then made in the support above the connection pieces 4-i. These openings can be produced by etching, e.g. reactive plasma etching in the presence of fluorine gas, through a mask e.g. produced by photolithography. In the openings obtained are produced metallic pieces 14-1, 14-2, 14-3, 14-4 e.g. by electrolytic metal growth (e.g. Cr, Ni, Ti, SnPb, In) with or without projecting. These pieces make it possible to establish an electrical contact between the pieces 4-i of the substrate 2 and the upper surface of the support.

The pieces 4-i can then be connected to a voltage source and the layer 12-substrate 2 assembly is dipped in a medium, e.g. a fluid medium, containing the ions to be deposited on the surface of the support on areas of said support 12 defined by the pieces 14-i. In the case of an electrolytic deposit, the substrate 2 is connected by its terminals to a generator 7 (FIG. 4C) and is dipped in an electrolytic bath 3, in which is also dipped a counterelectrode 13. This gives deposits 18-1, 18-2, 18-3, 18-4 on the surface of the support 12. There again, the deposits can be made by simultaneous or sequential addressing of the pieces 4-i and by immersing the support-substrate assembly in electrolytic baths which may contain different species.

This is followed (FIG. 4D) by a stage of separating the support 12 and the substrate 2. As the support 12 is of a polymeric material with a metallic connection, detachment can take place by thermal shock or mechanically.

Once again the major interest of the process is in the possibility of being able to reuse the substrate 2 for producing other deposits on other supports. The support 12 obtained with its deposits 18-1 can then e.g. be cut to produce sensors.

As illustrated in FIGS. 5A to 5G, the process using an insulating support can also use an intermediate, sacrificial layer (thermoplastic adhesive layer or selectively chemically etchable polymer layer, e.g. a layer of epoxy adhesive for a polyimide support).

Figure 5:
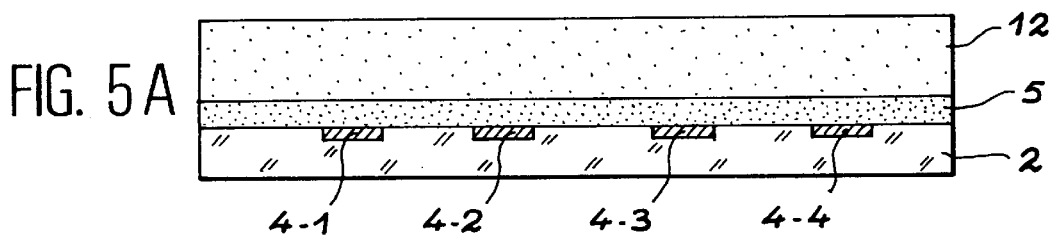
FIGS. 5A to 5G, 6A to 6E two variants of the second embodiment of the invention.
Figure 5:
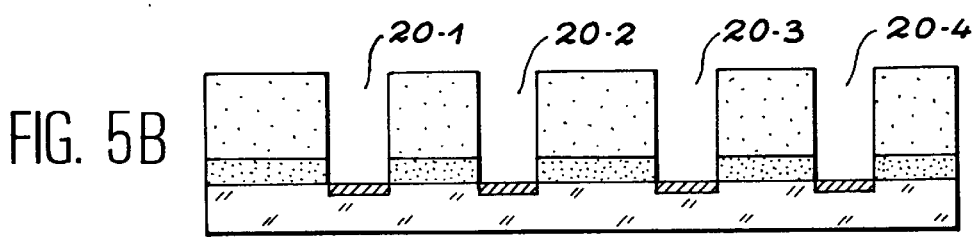
Figure 5C:
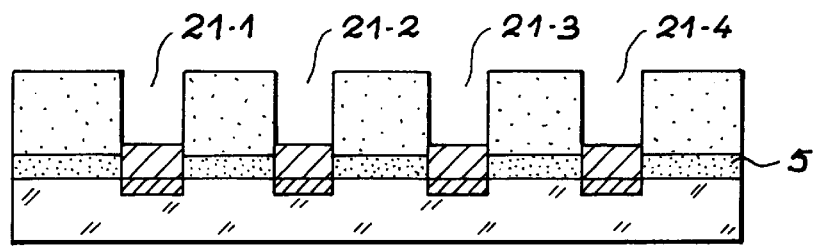
Figure 5D:
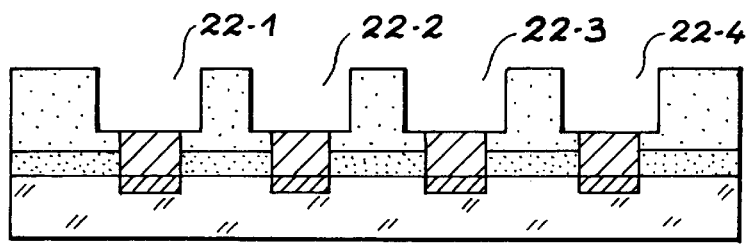
Figure 5E:
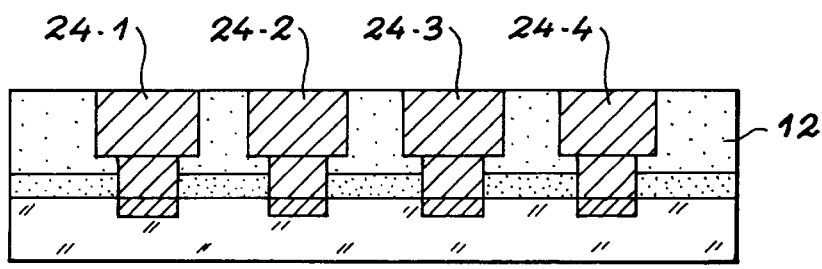

By photolithography and etching, windows 20-1, 20-2, 20-3, 20-4 are opened in the two layers 5 and 12 (FIG. 5B). In these windows are made metallic deposits, e.g. by electrolytic metal growth (Ni, Cr, Ti, SnPb, In) in order to produce an electrical contact through the intermediate layer 5. The deposit can be made over a thickness greater than that of the layer 5.

Optionally (FIG. 5D), a second lithography and etching stage makes it possible to open in the support 12 windows 22-1, 22-2, 22-3, 22-4 which are wider than those opened in the intermediate layer 5. The use of windows with different dimensions permits an easier separation of the support. Thus, the areas of limited width break before the wider areas. Then, thick metal deposits 24-1, 24-2, 24-3, 24-4 are made in these windows 22-i (FIG. 5E), e.g. by electrolytic metal growth above pieces 4-1 of the substrate 2 and connections 21-i made through the layer 5. Thus, a continuous electrical connection is established between each of the substrate pieces and the upper layer surface or support 12.

Figure 5F:
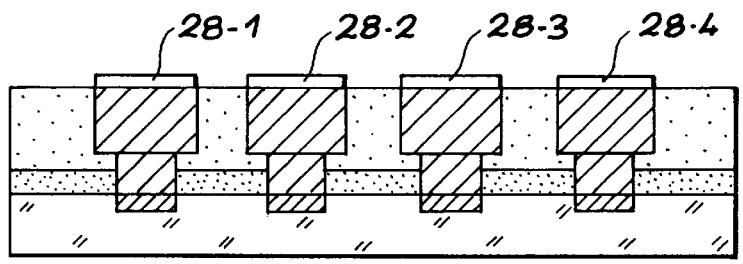
Figure 5G:
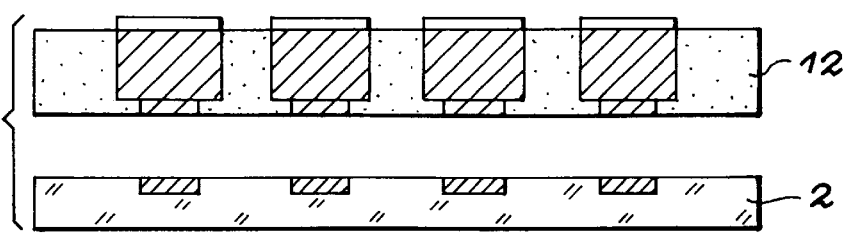

This is followed by deposits 28-1, 28-2, 28-3, 28-4 on the electrical connections on the upper surface of the support 12 (FIG. 5F). The assembly is dipped in an atmosphere or a fluid containing ions to be deposited and the pieces 4-i are connected to a voltage generator. In the case of an electrolytic deposit, a device similar to that described in conjunction with FIG. 4C is used. The deposits are consequently made simultaneously or sequentially.

The final stage involves the separation of the support 12 and the substrate 2 (FIG. 1G). Due to the presence of an intermediate layer 5 through which electrical connection pieces are formed, the same methods as described in conjunction with FIG. 3F can be used for making said separation. As shown, when the connection pieces of the intermediate layer are not etched during separation, they can remain on the electrical connections of the support. Once again the substrate 2 can be reused for other deposition stages on other supports.

According to another variant of the second embodiment (FIGS. 6A–6E) the support on which the deposit is made makes use of microsphere technology. The process which will now be described also uses an intermediate layer 5, e.g. a sacrificial layer, a thermoplastic adhesive layer or a paraffin-based compound or a layer of polymer selectively etchable compared with the support 32. However, another variant can be used, which does not require said intermediate layer.

Figure 6:
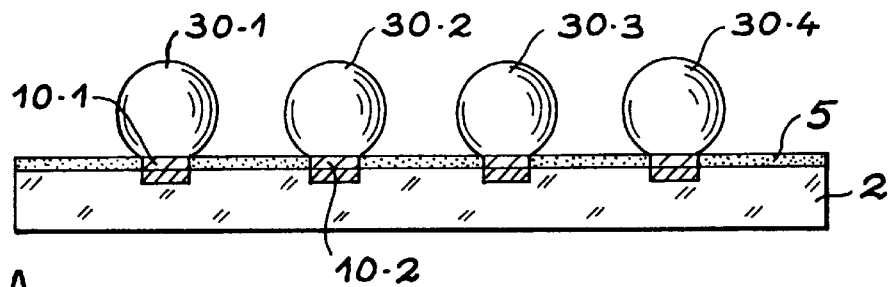
Figure 6:
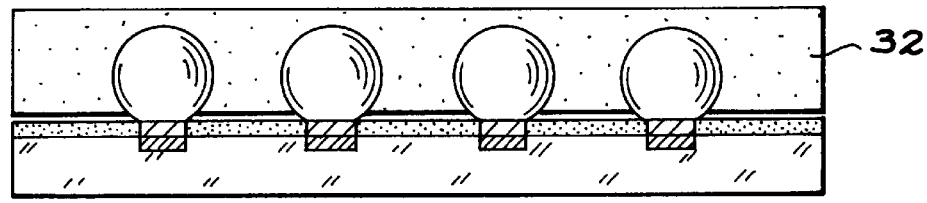
Figure 6:
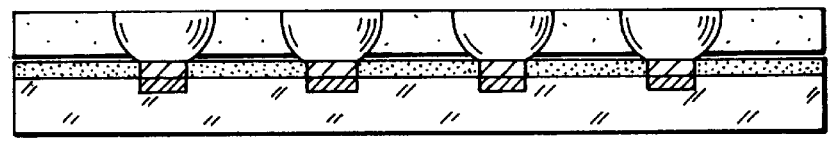
Figure 6:
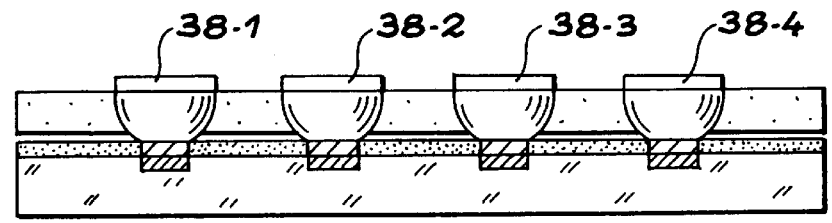
Figure 6:
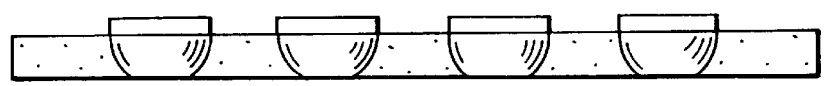

On the substrate 2 and layer 5, through which connections 10-i have been made, microspheres 30-1, 30-2, 30-3, 30-4 are deposited (FIG. 6A). A procedure for obtaining these microspheres is described in the article by J. Franka referred to hereinbefore and involves a process with electrolysis and remelting.

A layer 32 is formed above the intermediate layer 5 and can be an epoxy adhesive layer or a polyimide layer. The thickness of said layer can be such that its upper portion covers the upper portion of the spheres 30-i (FIG. 6B). In this case, in order to obtain an electrical contact on the surface of the support on which the deposit is to be made, a supplementary stage, e.g. grinding, makes it possible to bring the thickness of the assembly to a lower value (FIG. 6C). On the compound obtained it is then possible to produce deposits 38-i (i=1–4), in accordance with procedures described hereinbefore, e.g. electrochemical deposition (FIG. 6D). The following stage (FIG. 6E) is a separating stage, e.g. by heating, or by etching the intermediate layer 5. It is also possible to bring about a purely mechanical separation in the case where the support is directly formed on the substrate.

No matter what the chosen separation method, the interest of having a support with microspheres is as follows. Each microsphere is only in contact by a small surface with the electrical contact pieces 5-i of the substrate 2 or 10-i of the layer 5. The remainder of the surface of the microspheres is coated with the insulating material layer 32. The assembly can be torn or pulled away more easily during the support-substrate separating stage.

This problem of tearing or improving detachment of the support from the substrate can also be solved by using the process which will now be described in conjunction with FIGS. 7A to 7F.

A substrate 2 with its pieces 4-i is optionally covered with a sacrificial layer 5, which is etched and through which electrical connections 10-i are made. Optionally, a slightly wider metal deposit 40-i (i=1–4) can be made above each of the pieces 10-i. An insulating material layer 12 (FIG. 7B) is then deposited on the assembly.

Figure 7A:
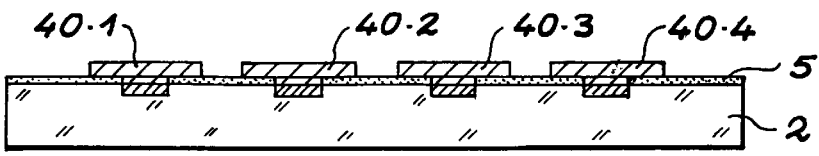
FIGS. 7A to 7F a third variant of the second embodiment of the invention.
Figure 7B:
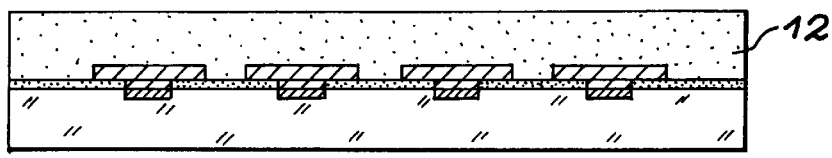
Figure 7C:
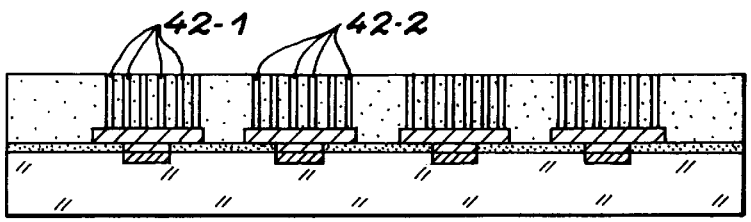
Figure 7D:
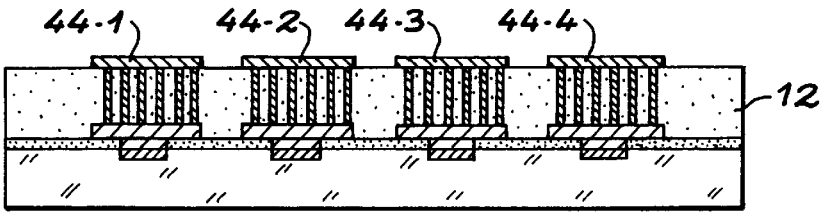

This is followed by an etching stage in the layer 12. However, on this occasion, the etching mask has a shape making it possible to produce, above each piece, a plurality of holes 42-i (i=1–4), whose axes are substantially parallel to one another (FIG. 7C).

These holes 42-i are then electrochemically filled by a contact metal such as gold or copper. A supplementary metal deposit 44-i (i=1–4) can then be formed on the surface of the support 12 in order to improve the electrochemical deposition conditions.

Figure 7E:
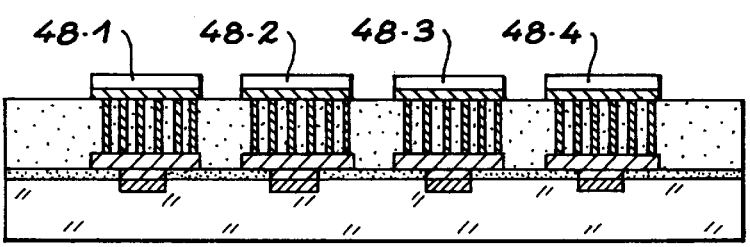
Figure 7F:
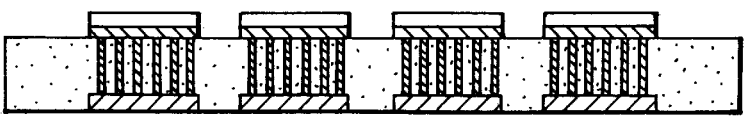

Thus, a component is obtained, on which it is possible to perform an electrochemical deposition, e.g. electrolytically, as described hereinbefore. Thus, a component is obtained which is covered with a plurality of deposits 48-1, . . . , 48-4 (FIG. 7E).

The support 12 with its deposits 48-i is then separated from the substrate 2, e.g. by heating or etching the sacrificial layer. Due to the shape given to the connection zones (holes 42-i with substantially parallel axes), the contact surface between on the one hand the pieces 40-i and on the other the connection means through the layer 12 is reduced, which facilitates the pulling off or detachment during the final stage. This avoids problems associated with a possible tearing of the support during this stage due to the large support material volume retained.

In the different variants of the invention, electrolytic metal growth can be formed by one or more metallic layers.

Moreover, in all cases, no matter which embodiment is envisaged, the support surface areas on which the deposit is to be made are preferably chosen beforehand so as to be compatible with said deposit. Thus, in the case of an electrolytic deposit and in the case where electrical connections are made through an insulating support, the upper portion of said connections flush with the support surface is in a material compatible with the bath of the electrolytic deposit. Otherwise, it is preferable to deposit beforehand on the area where the final deposit is to be made, a supplementary layer of a compatible material, e.g. a gold layer. This also applies when using an anisotropic layer.

As stated hereinbefore, it is possible after producing a deposit on a support and separating the support and substrate, to cut the support in order to obtain individual grouped deposits. FIGS. 8A to 8E diagrammatically show the individual structures obtained following such a deposition operation, for the different embodiments described hereinbefore. In all cases, a deposit 8, 18, 28, 38, 48 is obtained on a first face 51, 61, 71, 81, 91 of a support 50, 60, 70, 80, 90.

Figure 8:
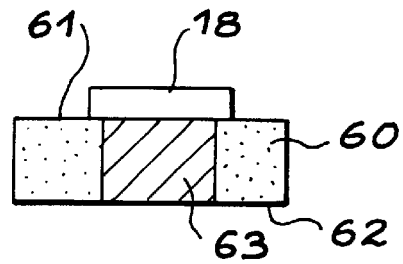
FIGS. 8A to 8E examples of deposits on a support according to the invention.
Figure 8:
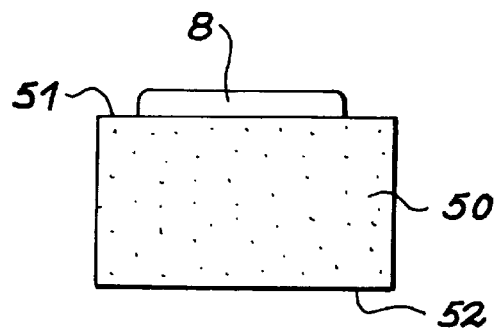
Figure 8:
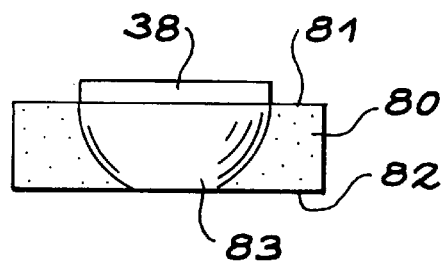
Figure 8:
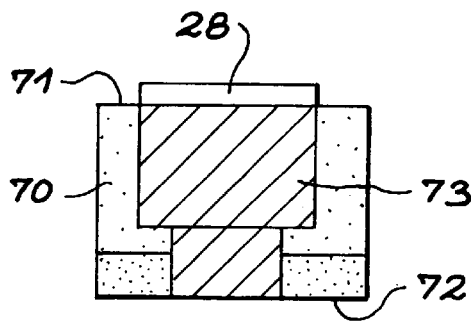
Figure 8:
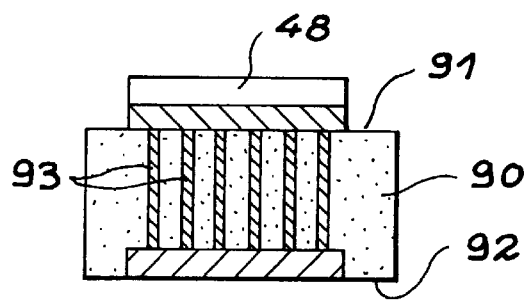

In the case of FIG. 8A, the support 50 is a z conductive element, e.g. a portion of an anisotropic conductive film or an anisotropic conductive elastomer.

In FIGS. 8B–8E, the support is an insulating element, e.g. of a polymeric material such as polyimide or an epoxy adhesive, or a mineral material, and is traversed by one or more conductive elements 63, 73, 83, 93, which electrically connect the first face and the second face 62, 72, 82, 92 of the support.

The different electrical connection means correspond to the different conductive elements described hereinbefore in conjunction with the variants of the embodiments of a process according to the invention.

It is also possible to carry out the cutting of a support, on which a deposit is to be made according to the invention, so as to no longer isolate individual deposits, but instead groups of N deposits (N≧2) on the same support, said support being of one of the types referred to hereinbefore and, if it is not an anisotropic conductor, incorporating electrical connection means of the type described hereinbefore.

In all cases, the substrate 2 on which the support is formed can be an electronic component substrate. Such a component can e.g. be of the type illustrated in FIG. 9.

FIG. 9 shows a support substrate 200 on which has been produced a plurality of electronic chips 210, 211, 212, 213, which are produced according to standard microelectronic processes. For legibility reasons, in FIG. 9 only four chips 210, 211, 212, 213 are shown, however, the same substrate wafer can have a large number of chips, e.g. 20 to 2000.

In the illustrated embodiment, the chips are identical. In each case they have a limited number of electrodes 230, 231, 232, 233, a multiplexing circuit 240, 241, 242, 243 and a plurality of individual addressing terminals 250, 251, 252, 253.

The substrate 200 also has collective addressing terminals 216. A connector 218 makes it possible to connect the terminals 216 to an external voltage source 220 able to supply addressing signals. The external voltage source can be an interface e.g. especially adapted to a microcomputer.

Following a chip validity test, said chips are interconnected in chip networks, which are established along connection planes in which the equivalent individual addressing terminals of each chip are respectively connected to corresponding collective addressing terminals of the support.

For illustration purposes, the individual terminals 250a, 251a, 252a and 253a of the chips 210, 211, 212, 213 are all interconnected and are connected to a corresponding collective terminal 216a.

The internal multiplexing circuit 240, 241, 242, 243 of each chip permits the selective addressing of one or more selected electrodes, as a function of an addressing signal e.g. applied to one of the individual terminals of the chip. For example, to a first addressing terminal 250a, 251a, 252a, 253a of each chip are applied the addressing signals of electrodes coming from the collective terminal 216a.

Second individual terminals of each chip, e.g. connected to the collective terminal 216b, are intended for the electrical supply of the chips.

Third individual terminals of each chip are e.g. connected to the collective terminal 216c by connections not shown in FIG. 2. These terminals are intended to supply to each chip an operating voltage, i.e. a voltage for the envisaged chemical reaction, said voltage being distributed on the addressed electrode or electrodes by the multiplexing circuit within each chip.

Finally, not shown, fourth individual terminals of the chips can be connected to a collective terminal of the substrate for a logic resetting of the chips.

I claim:

1. Process for producing an electrochemical deposit using a substrate with conductive pads for connecting the substrate to one or more voltage sources, the conductive pads being used as electrodes, said process comprising the following preliminary stages:

forming an intermediate layer on the substrate, said layer having a lower surface in contact with the substrate and an upper surface, producing electrical connections between the conductive pads of the substrate and the upper surface of the intermediate layer, forming a support in the form of a layer on top of the upper surface of the intermediate layer, said support being removable from the intermediate layer, the support providing electrical paths between the electrical connections of the intermediate layer and areas on a top surface of the support, said process subsequently comprising:

producing said electrochemical deposit on the areas of said top surface of the support in electrical contact with the conductive pads.

2. Process according to claim 1, the support being separated from the intermediate layer after producing the electrochemical deposit.

3. Process according to claim 1, the intermediate layer being a selectively thermally or chemically etchable sacrificial layer with respect to the substrate and the support.

4. Process according to claim 1, the intermediate layer being a thermoplastic adhesive layer, or a layer of compounds based on paraffin.

5. Process according to claim 1, the intermediate layer being an epoxy adhesive layer or a polyimide layer.

6. Process according to claim 5, the electrical connections between the conductive pads of the substrate and the upper surface of the intermediate layer being obtained by etching the intermediate layer, above the conductive pads, followed by the deposition or growth of conductive material in the etched areas obtained in this way in the intermediate layer.

7. Process according to claim 1, in which the electrical connections between the conductive pads and the upper surface of the intermediate layer are obtained by:

etching the intermediate layer down to the conductive pads; and depositing or growing conductive material in the etched areas of the intermediate layer.

8. Process according to claim 7, the deposition or growth of conductive material in the etched areas of the intermediate layer taking place over a thickness greater than that of the intermediate layer.

9. Process according to claim 7, the production of the electrical connections, between the conductive pads and the support surface, involving an etching of the support above the conductive pads and a deposition or growth stage of conductive material in the etched areas obtained in this way in the support, the etching of the support taking place prior to the etching of the intermediate layer such that etched areas extend down to the conductive pads and the deposition or growth of conductive material in the etched areas of the intermediate layer taking place prior to the deposition or growth of conductive materials in the support.

10. Process according to claim 9, the deposition or growth of conductive material in the etched areas of the intermediate layer being followed by a second etching stage for the support.

11. Process according to claim 1, the intermediate layer being a z-axis anisotropic conductive film.

12. Process according to claim 1, the support being an anisotropic conductive film.

13. The process according to claim 12 wherein the anisotropic conductive film is an anisotropic conductive elastomer.

14. Process according to claim 1, the support being a polymeric material or a material based on a mineral compound, the process also involving the step of producing electrical connections between the conductive pads of the substrate, or electrical connections of an intermediate layer formed on the top surface of the substrate, and the top surface of the support.

15. The process according the claim 14 wherein electrical connections are produced between electrical connections of an intermediate layer and the top surface of the support and the intermediate layer comprises a z-axis anisotropic conductive film.

16. Process according to claim 1, comprising the formation of electrically-conductive microspheres on the conductive pads of the substrate or the intermediate layer, followed by formation of the support by the deposition of the constituent material of the support around the microspheres and above the substrate or intermediate layer.

17. Process according to claim 1, further comprising, before the electrochemical depositing step, depositing a deposit compatible with the electrochemical material at least over the areas of the support which are to be covered by the electrochemical deposit.

18. Process according to claim 1, the conductive pads being directly connected to supply means.

19. Process according to claim 1, the conductive pads being connected to supply means by addressing and/or multiplexing means.

20. Process according to claim 1, the electrochemical deposit being an electrolytic deposit.

21. The process of claim 1, further comprising the steps of removing the support from the intermediate layer; and repeating the support forming and electrochemical deposition steps using another removable support layer.

22. A process for producing one or more electrochemical deposits on a top surface of a removable support, the process comprising:
  a) providing an insulating substrate having conductive pads on a top surface of said substrate, said conductive pads being electrically insulated from one another;
  b) providing a removable support having a top surface and a bottom surface, the bottom surface being adjacent to the top surface of the substrate, said removable support defining electrically conductive paths between the top surface and bottom surface thereof;
  c) connecting at least one of the conductive pads of the substrate to a voltage source to form an electrochemical deposit on areas of said top surface of the removable support which are in electrical contact with at least one of the conductive pads of the substrate;
  d) removing the support from the surface; and
  e) repeating steps b–d using another removable support.

23. Process according to claim 22, wherein the support is formed in situ on the substrate.

24. Processing according to claim 22, the support being an anisotropic coductive film.

25. The process according to claim 24 wherein the anisotropic conductive film is an anisotropic conductive elastomer.

26. Process according to claim 21, the support being a polymeric material or a material based on a mineral compound, the process also involving the step of producing electrical connections between the conductive pads of the substrate, or electrical connections of an intermediate layer formed on the top surface of the substrate, and the top surface of the support.

27. Process according to claim 22, the production of the electrical connections between the conductive pads and the top surface of the support, involving an etching of the support above the conductive pads and a deposition or growth stage of conductive materials in the thus obtained etched areas in the support.

28. Process according to claim 27, at least certain of the etched areas having in each case a plurality of holes with substantially parallel axes.

29. The process according the claim 26 wherein electrical connections are produced between electrical connections of an intermediate layer and the top surface of the support and the intermediate layer comprises a z-axis anisotropic conductive film.

30. Process according to claim 22, comprising the formation of electrically-conductive microspheres on the conductive pads of the substrate or an intermediate layer formed on top of the substrate, followed by the deposition of the constituent material of the support around the microspheres and above the substrate or intermediate layer.

31. Process according to claim 30, the deposition of the constituent material of the support being such that the constituent material covers the microspheres, the constituent material and microspheres being an assembly, further including the step of reducing the thickness of the assembly to allow the exposure of a section of the microspheres.

32. Process according to claim 22, further comprising, before the electrochemical depositing step, depositing a material compatible with the electrochemical deposit over the areas of the support which are to be covered by the electrochemical deposit.

33. Process according to claim 22, the conductive pads being directly connected to supply means.

34. Process according to claim 22, the substrate pieces being connected to supply means by addressing and/or multiplexing means.

35. Process according to claim 22, the electrochemical deposit being an electrolytic deposit.

* * * * *